United States Patent [19]

Chen

[11] 4,277,846
[45] Jul. 7, 1981

[54] CIRCUIT FOR STABILIZING THE OUTPUT OF AN INJECTION LASER

[75] Inventor: Fang-Shang Chen, New Providence, N.J.

[73] Assignee: Bell Telephone Laboratories, Incorporated, Murray Hill, N.J.

[21] Appl. No.: 107,510

[22] Filed: Dec. 27, 1979

[51] Int. Cl.³ .............................................. H04B 9/00
[52] U.S. Cl. .................................. 455/611; 332/7.51; 455/613
[58] Field of Search ................ 455/611, 613; 332/7.51

[56] References Cited

U.S. PATENT DOCUMENTS 4,009,385    2/1977    Sell ..................................... 332/7.51

OTHER PUBLICATIONS

*Electronics Letters*, vol. 14, No. 24, Nov. 23, 1978, pp. 775-776, "Laser Level-Control Circuit for High-Bit-Rate System Using a Slope Detector".
*IEEE Transactions on Communications* COM-26(7), Jul. 1978, pp. 1088-1098, "Electronic Circuits for High Bit Rate Digital Fiber Optic Communications Systems."
*Second European Conference on Optical Fiber Communications* (Paris, France), 1976, pp. 337-382, "Subsystems for High Speed Optical Links".
*Fourth European Conference on Optical Fiber Communications* (Genova, Italy), 1978, pp. 438-448, "Level Control Circuit for Injection Laser Transmitters".

*Primary Examiner*—Howard W. Britton
*Attorney, Agent, or Firm*—Arthur J. Torsiglieri

[57] ABSTRACT

A digitally modulated injection laser is provided with a control circuit to keep constant both its "zero" and "one" light output values despite changes in duty cycle and aging effects. The circuit includes one branch which maintains constant the average light value and another branch which maintains constant the difference between the "one" value and the average light value.

4 Claims, 2 Drawing Figures

CIRCUIT FOR STABILIZING THE OUTPUT OF AN INJECTION LASER

BACKGROUND OF THE INVENTION

1. Field of the Invention

This invention relates to a circuit for stabilizing the output of an injection laser being used as the light source in a digital lightwave communications system.

2. Description of the Prior Art

It is known that the operating characteristics of most injection lasers vary significantly with aging and with ambient temperature. In particular, typically the lasing threshold increases with temperature and age while the slope of the light-current transfer characteristic decreases with temperature and age. Additionally, with time some lasers develop nonlinearities in the light-vs-current transfer characteristic.

In digital lightwave systems, particularly those operating at high bit rates, it is important to compensate for these changes if the operation is to be relatively maintenance free for extended periods of time.

In such systems, lasers are usually biased with a d-c current $I_b$ near the lasing threshold and a modulation current $I_m$ is superimposed on the bias to swing the light output from its "OFF" state value $L_o$, selectively under signal control, to its "ON" state value $L_1$. Changes in $L_o$ and/or $L_1$ degrade the performance of the system and so are undesirable.

To achieve the desired compensation with aging of the critical parameters, it is common to vary appropriately these two currents so that any two linear combinations of the "OFF" light lever $L_c$, "ON" light level $L_1$ and the time-averaged light value $L_{av}$ are kept constant. Since $L_{av}$ is proportional to the duty cycle of the data signal, a measure of the duty cycle has to be provided to the control arrangements if the duty cycle is not constant. The duty cycle is the fraction of the time that the laser is in its "ON" state. Several control arrangements based on these currents have been proposed hitherto. However, these all suffer from one or more deficiencies.

In particular, at the Second European Conference on Optical Fiber Communications, held in Paris, France, in 1976, there was presented a paper entitled "Subsystems for High Speed Optical Links" which described a control arrangement in which the "OFF" level $L_o$ was kept constant by feedback control of the bias $I_b$, while the difference $L_1-L_o$ was kept constant by feedback control of the modulating current $I_m$. It is characteristic of control arrangements, which depend on control of $L_o$, that they involve the difference of two relatively large values, each approximately equal to the average light value $L_{av}$. As is well known, such arrangements generally are undesirable because a relatively small error in deriving either of the two large values results in a disproportionately large error in their difference. Moreover, this arrangement depends on an idealistic assumption that the duty cycle does not vary with time. However, such assumptions are not always warranted in practice.

There has appeared in the *IEEE Transactions on Communications* COM-26(7) 1088, (1978) a paper entitled "Electronic Circuits for High Bit Rate Digital Fiber Optic Communications Systems." In this paper, there is recognized the importance of the duty cycle and there is proposed a control arrangement which is relatively independent of duty cycle. However, this arrangement also is based on using the bias current to control $L_o$, with the same objection that this involves deriving the difference of two comparably large quantities with the resultant disadvantage mentioned.

In the Fourth European Conference on Optical Fiber Communications, held at Genoa, Italy, in 1978, there was presented a paper entitled "Level Control Circuit for Injection Laser Transmitters." This paper describes a control arrangement in which the bias current $I_b$ is used to keep constant the average light $L_{av}$, and the modulating current $I_m$ is used to keep constant the difference $L_1-L_o$. However, this arrangement too is dependent on the duty cycle and so is vulnerable to changes in it.

In *Electronics Letters*, 23 Nov. 1978, Vol. 14, No. 24, there appears a paper entitled "Laser Level Control Circuit for High-Bit-Rate Systems Using a Slope Detector." This paper describes a circuit that detects the change of slope of the light-output L/Current I transfer characteristic of the laser at the threshold knee to control the difference $L_1-L_o$, and a mean-power circuit is used to keep constant the average light $L_{av}$. This circuit is vulnerable to nonlinearities in the transfer characteristic away from the threshold knee of the characteristic, and this arrangement too is dependent on the duty cycle.

An object of my invention is a control circuit which essentially avoids all of the various difficulties mentioned for the arrangements discussed above.

SUMMARY OF THE INVENTION

In particular, the control circuit of my invention involves a pair of feedback control loops, one of which controls the bias current $I_b$ to maintain essentially constant the average light $L_{av}$ and the other of which controls the modulating current $I_m$ to maintain essentially constant the difference between the "ON" value $L_1$ and the average value $L_{av}$ for constant duty cycle. Moreover, each of these loops includes compensation for changes in the duty cycle.

In an illustrative embodiment of the invention, the input train of signal information pulses is simultaneously supplied both to a driver circuit and to a generator of a pair of complementary reference voltages, each of which provides a measure of the duty cycle. The driver circuit is designed to provide the modulating current to the injection laser, the amount of current being controlled by a current source in the driver circuit, which source is controlled by the output of a modulating current control circuit. This circuit is controlled both by the output of a peak detector which provides a measure of the difference between the peak light output and the average light output and by one of the two comlementary voltages providing a measure of the duty cycle. The injection laser is also continuously supplied with a bias current provided by a bias control circuit which is controlled both by the average light output and by the other of the other complementary reference voltages.

A feature of my invention is a circuit which derives duty-cycle information from the regenerated input signal in the form of a complementary pair of voltages and uses these voltages to control $L_{av}$ through control of $I_b$ and to control the difference of $L_1-L_{av}$ through control of $I_m$.

DETAILED DESCRIPTION

Figure 1:
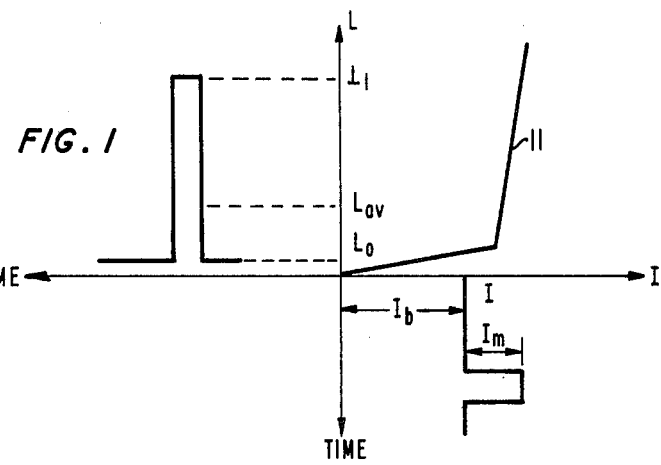
FIG. 1 illustrates characteristics of an injection laser and will be helpful in a discussion of the invention.

In FIG. 1, there is shown the light-current transfer characteristic 11 of the typical injection laser. The light is low until the current passes a threshold value $I_t$ after which it increases rapidly. In a digital light system, it is usual practice to provide a bias current $I_b$ near threshold to provide a steady state light output $L_o$, corresponding to the "zero" or "OFF" state. There is added to the bias current a train of current pulses, each desirably of uniform amplitude $I_m$, indicative of the signal information. When the current to the laser is the sum of $I_b$ and $I_m$, the light output will have its "one" or "ON" value $L_1$. There will be a time-averaged light output value $L_{av}$ which will vary, depending on the duty cycle of the laser.

With aging of a laser, $I_t$ tends to increase and the quantum efficiency (the slope of the light-current characteristic) tends to decrease or develop nonlinearities in the light-current characteristics, requiring a larger current for the same light output. In accordance with our invention, to compensate for the increased $I_t$, $I_b$ will be increased and to compensate for changes in the slope of the transfer characteristic, $I_m$ will be increased. Moreover, in accordance with the invention, there will be monitored $L_{av}$ to control $I_b$ and $L_1-L_{av}$ to control $I_m$ in a manner that takes into account the instant value of the duty cycle.

Figure 2:
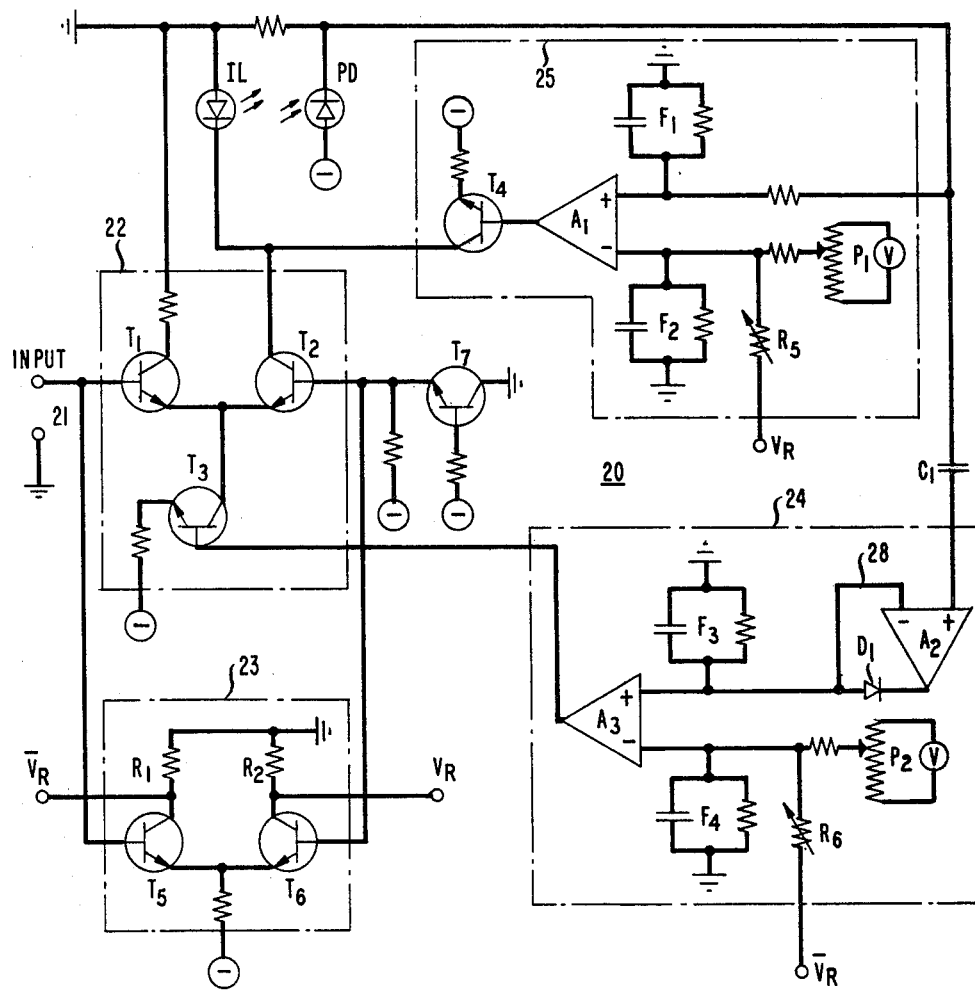
FIG. 2 shows an illustrative circuit suitable for the practice of the invention.

With reference now to the circuit 20 shown in FIG. 2, the output train of signal pulses is applied between the input pair of terminals 21 and then supplied to both the driver branch enclosed within broken lines 22 and the regenerator branch enclosed within broken lines 23. The driver, which is used to provide the modulating current $I_m$ to the laser, comprises a pair of matched NPN transistors $T_1$ and $T_2$ connected as an emitter-coupled current switch. When the base of $T_1$ is more positive than the base of $T_2$ all the current is steered through the collector of $T_1$ to ground and no current is applied to the injection laser IL. Conversely, when the base of $T_2$ is more positive than the base of $T_1$, all the current is steered through the collector of $T_2$ and flows to the injection laser IL.

The selection of one of these two conditions is deteminmed by whether a "zero" or a "one" voltage is applied at the input terminal connected to the base of $T_1$. The voltage on the base of transistor $T_2$ is maintained at a steady d-c value corresponding to the midway point between the "zero" and "one" values by the grounded collector NPN transistor $T_7$ which provides a fixed d-c voltage at its emitter for use at the base of $T_2$. To control the modulating current, the emitters of $T_1$ and $T_2$ are connected to the collector of transistor $T_3$ which acts as the current source for $T_1$ and $T_2$ and has its base supplied with the output of the modulating current control branch enclosed within the broken lines 24. The emitter of $T_3$ is connected to the negative terminal of the voltage supply through a resistor.

The regenerator 23 is used to derive at any instant a pair of complementary pulses $V_R$ and $\overline{V_R}$ for use in the modulating current control branch 24 and the bias current control branch enclosed within broken lines 25, respectively, to sensitize these control branches to the duty cycle so that the output of each is compensated for the duty cycle then prevailing.

In effect, the regenerator provides a pair of pulse trains, which match the pulse trains appearing at the collectors of $T_1$ and $T_2$ but which are more uniform in amplitude than the input signal pulses and so more useful as a reference. The regenerator, accordingly, also uses a similar matched pair of emitter-coupled NPN transistors $T_5$ and $T_6$ with relatively large load resistors $R_1$ and $R_2$. In this instance the emitters are coupled through emitter resistor $R_3$ to the negative terminal of a fixed d-c voltage supply.

The input train of signal pulses is applied to the base of transistor $T_5$ and the base of transistor $T_6$ is supplied with a fixed d-c voltage from the emitter of transistor $T_7$ in the manner discussed for $T_2$. At the collectors of $T_5$ and $T_6$ there are derived voltages $V_R$ and $\overline{V_R}$, respectively, for use in the control circuits. $V_R$ will have the same pattern as will the laser light and $\overline{V_R}$ will have a pattern which is the complement.

For monitoring the light output of the laser for use by the control branches, light exiting from the back mirror of the laser advantageously may be used since it can be arranged to have this back intensity of the laser track closely the front intensity used to supply the signal transmission path, typically an optical fiber, although the two intensities need not be equal. This light is made incident on the photodetector PD, typically a PIN photodiode, which is appropriately biased as shown. Or, alternatively, light exiting from the front mirror may be tapped off for use by the control circuit.

The resulting photovoltage is applied simultaneously both to the modulating current control branch 24 and to the bias control branch 25.

The photovoltage provided by the photodiode PD is applied to the bias current control branch 25 for providing a bias current to the laser which serves to keep $L_{av}$ compensated for the duty cycle. To this end the photovoltage is applied to the noninverting terminal of differential amplifier $A_1$. A parallel RC combination with a relatively long time constant serves as a smoothing filter $F_1$ to provide an averaging effect on the photovoltage. To provide duty cycle compensation, the reference voltage $\overline{V_R}$ derived from the regenerator branch 23 is applied to the inverting input of the difference amplifier $A_1$, advantageously by way of a variable resistor $R_5$. A parallel RC combination with a relatively long time constant serves as the smoothing filter $F_2$ to provide an averaging effect. Also applied to the inverting input of $A_1$ is a d-c voltage derived from the potentiometer $P_1$. The settings of the potentiometer $P_1$ and the resistor $R_5$ are adjusted so that the bias current $I_b$ supplied to the injection laser is that required to bias it near threshold to provide the desired $L_o$ level of light. I have found it advantageous to operate slightly below threshold in systems operating at fifty megabits. Advantageously, a current amplifier $T_4$ is included between the output of differential amplifier $A_1$ and the input to the laser.

Additionally, the photovoltage is supplied to the modulating current control branch 24. The photovoltage is applied by way of the capacitor $C_1$ which blocks the d-c component and passes only the a-c component. This is then applied to a peak detector made up of the operational amplifier $A_2$, the diode $D_1$ and the feedback lead 28. In particular, the photovoltage a-c component is applied to the noninverting input of the operational amplifier and the lead 28 feeds back a portion of the output to the inverting lead of the operational amplifier. The diode $D_1$ is connected between the output of the amplifier and the feedback lead 28.

The output of the peak detector after smoothing by action of the parallel RC combination forming filter $F_3$, is a measure of the difference $L_1-L_{av}$. It is then applied to the noninverting input of the differential amplifier $A_3$ and a voltage derived from potentiometer $P_2$ is applied to the inverting input of amplifier $A_3$. Also applied to this input is the reference voltage $V_R$ by way of the variable resistor $R_6$ after smoothing by the action of the parallel RC combination forming filter $F_4$. The settings of the potentiometer $P_2$ and the variable resistor $R_6$ are set to provide a value of $I_m$ which, superposed on the bias current $I_b$, will provide the desired level of light $L_1$ from the laser corresponding to an input "one."

It may be desirable to adjust the various variable resistors and potentiometers initially at a small duty cycle and then at a large duty cycle. Then the circuit would maintain $L_o$ and $L_1$ constant independent of the duty cycle.

There is being filed contemporaneously with this application my application Ser. No. 107,511 which has the same assignee. Such application relates to a system for compensating for changes in the laser-fiber coupling and uses a control loop which varies $I_b$ to compensate for changes in the coupling. In some arrangements, it may prove desirable to combine the control arrangements of my two applications.

I claim:

1. A circuit for maintaining substantially constant the light output of the "ON" and "OFF" states of an injection laser to be supplied with an input signal train for use as the transmitter in a digital lightwave system comprising means for monitoring the light output from a laser and developing a photovoltage which is a measure of such output, control means supplied both with said photovoltage and with a voltage which is a measure of the duty cycle of the input train for providing a bias current to the laser which is a measure of the average light output compensated for the duty cycle, control means supplied both with said photovoltage and with a voltage which is a measure of the duty cycle of the input train for providing a control voltage which is a measure of the difference between the peak light output and the average light output compensated for the duty cycle, and means supplied both which the input train and said control voltage for providing modulating current to the laser.

2. A circuit in accordance with claim 1 including means supplied with the input train of pulses and deriving a pair of complementary trains of pulses, one for supply to the first-mentioned control means, and the other for supply to the second-mentioned control means.

3. A circuit in accordance with claim 1 in which the means for providing the modulating current to the laser comprises an emitter-coupled transistor pair current switch having as the current source a transistor supplied with the output of said second mentioned control means.

4. A circuit in accordance with claim 2 in which the means for providing the modulating current to the laser comprises an emitter-coupled transistor pair current switch having as the current source a transistor supplied with the output of said second mentioned control means.

* * * * *